United States Patent
Kim

[11] Patent Number: 5,875,219
[45] Date of Patent: Feb. 23, 1999

[54] PHASE DELAY CORRECTION APPARATUS

[75] Inventor: Dae Jeong Kim, Seoul, Rep. of Korea

[73] Assignee: LG Semicon Co., Ltd., Cheongju, Rep. of Korea

[21] Appl. No.: 778,354

[22] Filed: Jan. 2, 1997

[30] Foreign Application Priority Data

Jan. 27, 1996 [KR] Rep. of Korea ............... 1996-1803

[51] Int. Cl.[6] ................................... H03D 3/24
[52] U.S. Cl. ................ 375/376; 375/376; 375/373; 375/371; 327/156; 327/155; 327/144; 327/244; 327/243
[58] Field of Search ................... 375/376, 373, 375/371, 354, 200, 367; 327/158, 152, 156, 159, 161, 244, 295, 155, 141, 243; 331/14, 25

[56] References Cited

U.S. PATENT DOCUMENTS

| | | | |
|---|---|---|---|
| 4,221,005 | 9/1980 | La Flame | 375/367 |
| 5,062,122 | 10/1991 | Pham et al. | 375/200 |
| 5,087,829 | 2/1992 | Ishibashi et al. | 327/152 |
| 5,179,574 | 1/1993 | Watanabe et al. | 375/376 |
| 5,579,351 | 11/1996 | Kim | 375/371 |
| 5,646,564 | 7/1997 | Erickson et al. | 327/158 |

*Primary Examiner*—Stephen Chin
*Assistant Examiner*—Michael W. Maddox
*Attorney, Agent, or Firm*—Fleshner & Kim

[57] ABSTRACT

A digital delay locked loop (DLL) includes a phase detector for outputting a comparing signal by comparing a system clock signal with a chip clock signal, a shift register for sequentially shifting data bit values in both the directions in accordance with the comparing signal, a phase delay unit for delaying and outputting the system clock signal in accordance with each bit value of the shift register, a domain selecting controller for detecting an overflow or an underflow condition of the shift register and outputting a domain selection controlling signal, and a domain selector for adjusting the phase of a driving signal from one region comprising 0°~180° and to another area comprising 180°~360° and carrying out a domain transition whenever an overflow or an underflow condition is generated when the phase reaches a boundary region of the two domains.

9 Claims, 7 Drawing Sheets

FIG.8A CLKINT
FIG.8B Ø1
FIG.8C Ø2
FIG.8D ØN
FIG.8E ØN+1
FIG.8F ØN+2

PHASE DELAY CORRECTION APPARATUS

BACKGROUND OF THE INVENTION

1. Field of the Invention

The present invention relates to a digital phase delay locked loop (DLL), and in particular, to an improved phase delay correction apparatus which is capable of embodying a precise resolution and an indefinite delay range with a minimum number of delay units by applying a domain classifying concept.

2. Description of the Conventional Art

Figure 1:
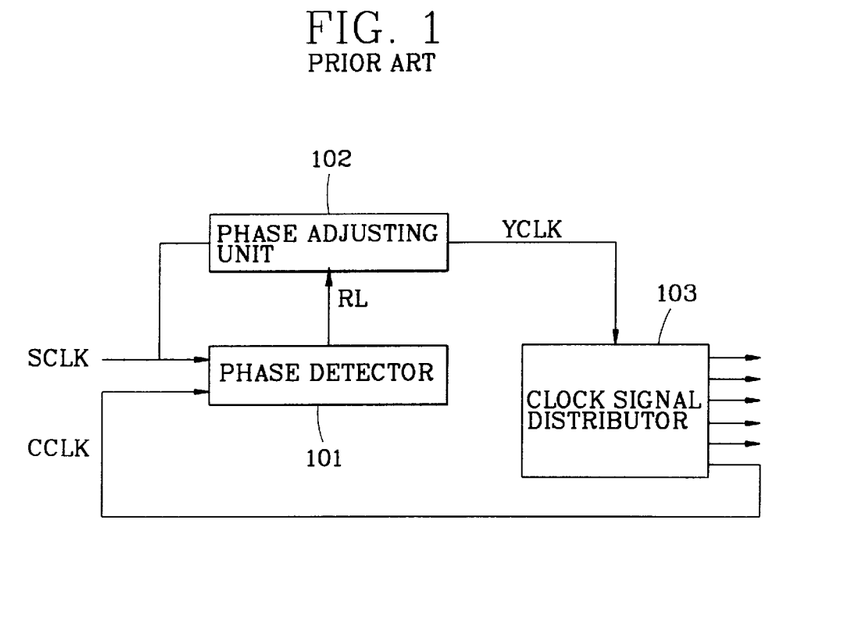
FIG. 1 is a schematic block diagram of a phase delay correction apparatus according to the conventional art.

As shown in FIG. 1, a conventional phase delay correction apparatus includes a phase detector 101 for outputting a comparing signal (RL) by comparing the phase of a chip clock signal (CCLK) on the basis of a system clock signal (SCLK), a phase adjusting unit 102 for outputting a phase-adjusted clock signal (YCLK) by sequentially delaying the system clock signal (SCLK) in accordance with the comparing signal (RL) of the phase detector 101, and a clock signal distributor 103 for supplying the phase-adjusted clock signal (YCLK) to the inside of a chip by distributing the phase-adjusted clock signal (YCLK) of the phase adjusting unit 102 and for feeding back the phase-adjusted clock signal (YCLK) to the phase detector 101 as the chip clock signal (CCLK).

Figure 2:
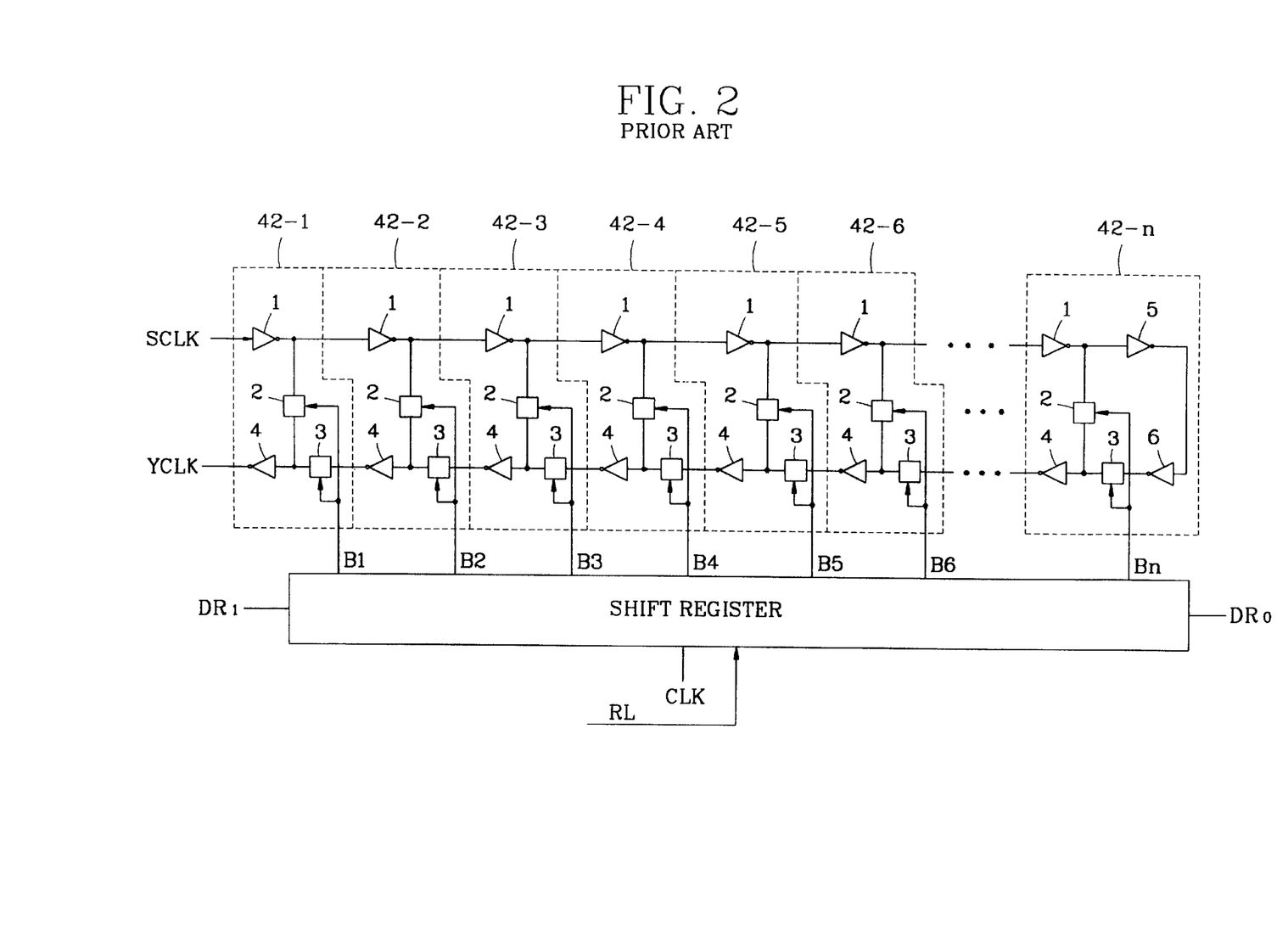
FIG. 2 is a detailed schematic block diagram of a phase adjusting unit of FIG. 1 according to the conventional art.

As shown in FIG. 2, the phase adjusting unit 102 includes a shift register 41 for shifting the data "1" by one bit to the right from the input side (DR) when the comparing signal (RL) of the phase detector 101 is "1", synchronized with the clock signal (CLK) and for shifting the data "0" by one bit to the left from the input side (DL) when the comparing signal (RL) thereof is "0", synchronized with the system clock signal (SCLK), and a plurality of delay units 42-1, 42-2, . . . 42-n for outputting a phase-adjusted clock signal (YCLK) by sequentially delaying the system clock signal (SCLK) in accordance with each bit value (B1 . . . Bn) of the shift register 41.

The plurality of delay units 42-1,42-2 . . . 42-n include first inverters 1 each for inverting a system clock signal, first pass gates 2 connected in parallel with the output terminals of the first inverters 1 and which are turned on when the corresponding bit value of the shift register 41 is "1", second pass gates 3 the output terminals of which are commonly connected to the output terminals of the first pass gates 2 and which are turned on when the corresponding bit value of the shift register 41 is "1", and second inverters 4 for outputting the phase-adjusted clock signal (YCLK) by inverting the outputs of the first inverters 1 inputted through the first pass gate 2 or the clock signal which is fed back from the succeeding delay unit through the second pass gate 3.

In the last delay unit 42-n, two inverters 5,6 are additionally connected in series between the first inverters 1 and the second pass gate 3.

Referring to FIG. 1 and FIG. 2, the operation of the conventional phase delay correction apparatus will now be described in detail.

The phase detector 101 compares the phase of the system clock signal (SCLK) with the phase of the chip clock signal (CCLK) and outputs the comparing signal (RL) to the phase adjusting unit 102, wherein the comparing signal (RL) is "1" when the phase of the chip clock signal (CCLK) is leading, and is "0" when the phase of the chip clock signal (CCLK) is trailing.

Here, as shown in FIG. 2, when the comparing signal is "1", the shift register 41 of the digital data line 102 shifts the data "1" by one bit from the input side (DR) to the right side, synchronized with the system clock signal (SCLK), and when the comparing signal is "0", synchronized with the system clock signal (SCLK), the shift register 41 shifts the data "0" by one bit from the input side (DL) to the left, and outputs the bit values to the plurality of delay unit 42-1, 42-2, . . . ,42-n.

Therefore, as the first and second pass gates 2,3 of the plurality of delay units 42-1,42-2, . . . ,42-n are turned on complementarily in accordance with each bit value (B1, B2, . . . ,Bn) shifted to the right or the left, a delay chain is formed comprising the first inverters 1 and the second inverters 4.

For example, when all the bits of the shift register 41 are "0", the first pass gates 2 are all turned on, and the second pass gates 3 are all turned off, and therefore, only the inverters 1,4 of the delay unit 42-1 form a delay chain, and the minimum delay of the system clock signal (SCLK) occurs.

Through the delay units 42-1,42-2, . . . ,42-n, the phase-adjusted clock signal (YCLK) is outputted to the clock signal distributor 103, which outputs a chip clock signal (CCLK) to the inside of the chip for detecting various versions of clock signals and phases within the chip, and feeds back the same and the phase detector 101. Afterwards, the identical operation is repeated.

However, since the delay range according to the conventional phase delay correction apparatus depends on the number of the delay units, the number of the delay units should be arranged so that a minimum delay occurs and a phase shift of more than 360° may be achieved.

But, in the delay unit of the phase adjusting unit, a delay occurs through two inverters and one pass gate in a minimum delay condition, and when the delay is increased, since the delay through one pass gate is added, it has been difficult to achieve a resolution below 400 ps(Pico sec) due to the increase in the delay.

SUMMARY OF THE INVENTION

Accordingly, it is an object of the present invention to provide an improved phase delay correction apparatus having an indefinite delay range and to embody a phase shift having a precise resolution using a minimum number of delay elements in the delay unit by dividing the phase shift domain by two and by enabling an output drive of the phase adjusting unit to shift the phase by 180° between the two domains.

To achieve the above object, there is provided a digital phase delay locked loop (DLL) including a phase detector for outputting a comparing signal by comparing the phase of a system clock signal with that of a clip clock signal, and a clock signal distributor for distributing a chip clock signal and feeding the signal back to the phase detector. In addition, the digital delay locked loop includes a shift register for shifting data(1 or 0) bit values sequentially in accordance with the comparing signal from the phase detector and outputting an overflow signal or an underflow signal of the shifted data, a phase delay unit for outputting a phase-adjusted clock signal by delaying the system clock signal in accordance with the bit values of the shift register, a domain selecting controller for outputting a domain controlling signal by detecting the overflow signal or the underflow signal generated by the shift register, and a domain selector for outputting a driving signal of the domain operation in accordance with a domain controlling signal.

DETAILED DESCRIPTION OF THE PREFERRED EMBODIMENTS

Figure 3:
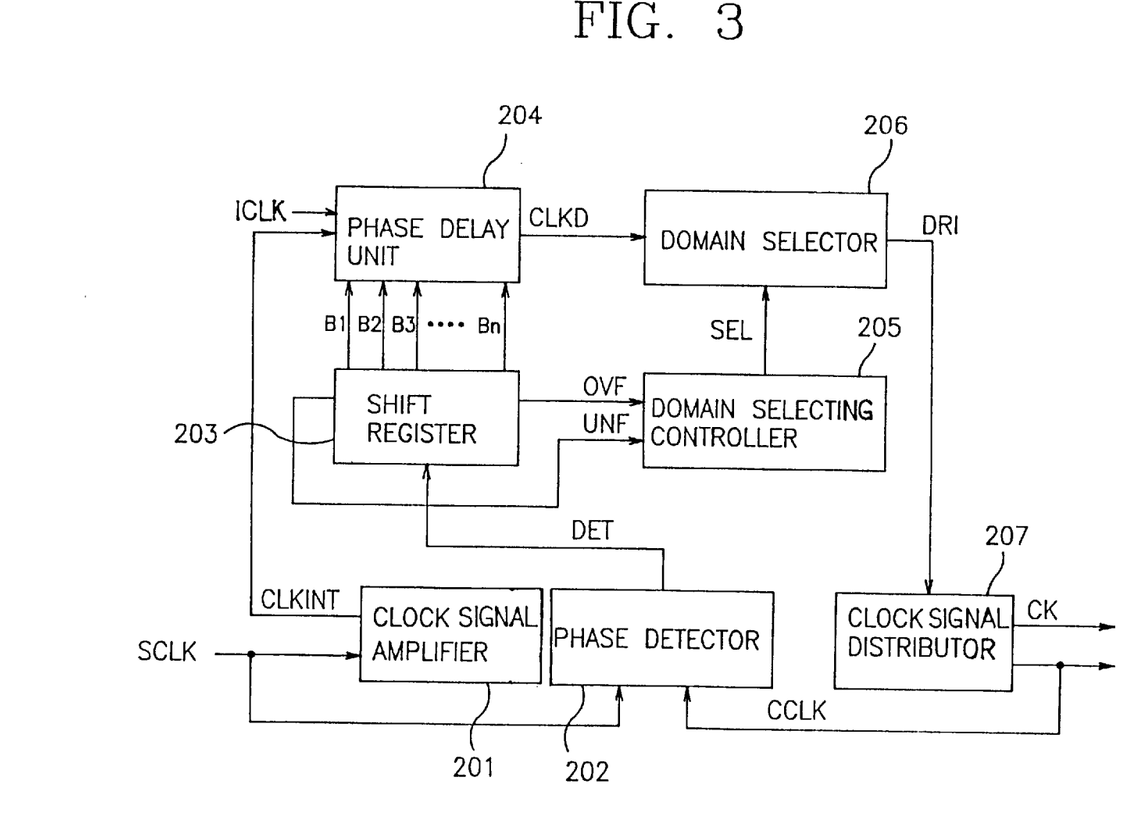
FIG. 3 is a schematic block diagram of a phase delay correction apparatus according to the present invention.

FIG. 3 is a schematic block diagram of a phase delay correction apparatus according to the present invention, which includes a clock signal amplifier 201 for amplifying a system clock signal (SCLK), a phase detector 202 for outputting a comparing signal (DET) by comparing the phases of the system clock signal (SCLK) and a chip clock signal (CCLK), a shift register 203 for sequentially shifting data (0 or 1) in two directions in accordance with the comparing signal (DET) from the phase detector 202, a phase delay unit 204 for outputting a phase-adjusted clock signal (CKLD) by delaying the output of the clock signal amplifier 201 in accordance with the bit values of the shift register 203, a domain selecting controller 205 for outputting a domain selection controlling signal (SEL) by detecting an overflow signal (OVF) or an underflow signal (UNF) generated by the shift register 203, a domain selector 206 for outputting a driving signal (DRI) of an operation domain corresponding to the domain selection controlling signal (SEL) from the domain selecting controller 205, and a clock signal distributor 207 for distributing a clock signal (CK) and the chip clock signal (CCLK) in accordance with the driving signal (DRI) from the domain selector 206 and feeding back the clock signal (CK) and the chip clock signal (CCLK) to the phase detector 202.

Figure 4:
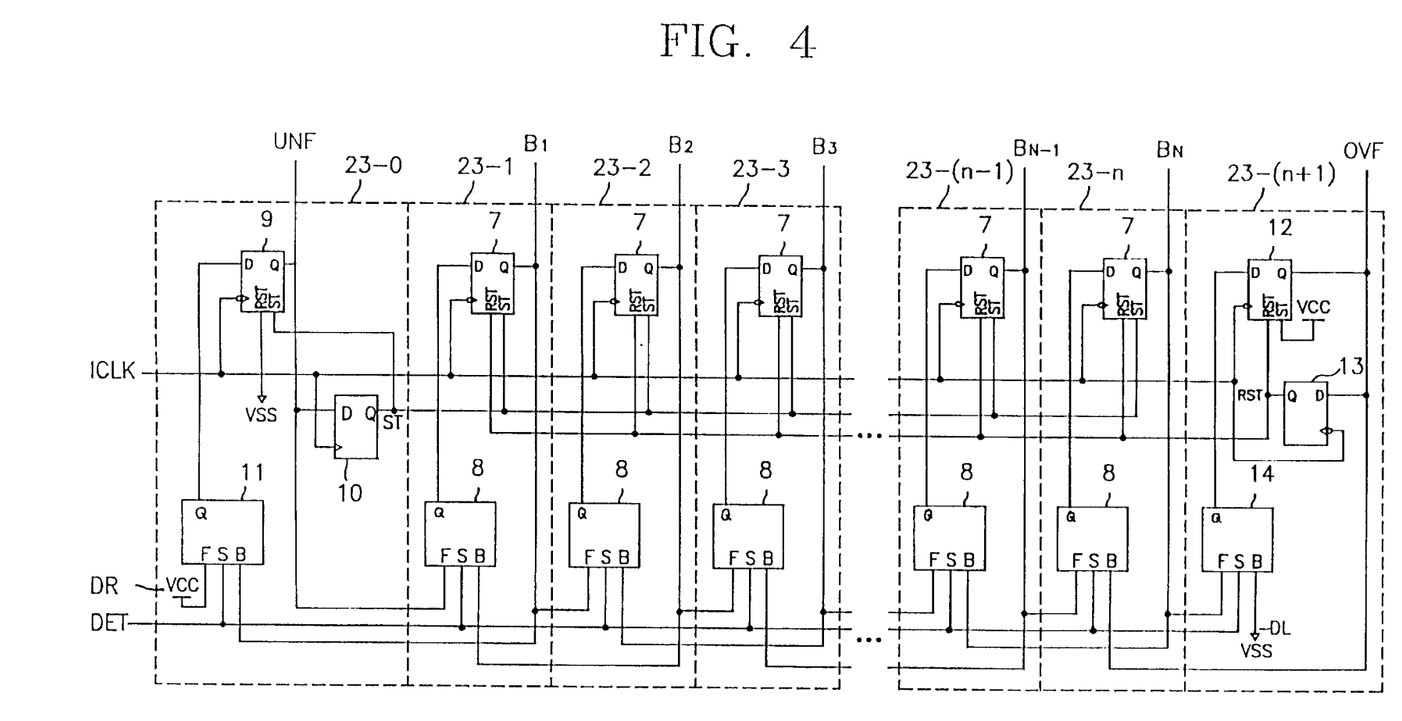
FIG. 4 is a detailed schematic block diagram of a shift register in FIG. 3.

As shown in FIG. 4, the shift register 203 includes data bit units 23-1, . . . ,23-n, underflow bit detecting unit 23-0, and overflow bit data unit 23-(N+1). When the comparing signal (DET) from the phase detector 202 is "1", the data bit units 23-1, . . . ,23-n shift the data "1" by one bit to the right from the input side (DR), synchronized with an internal clock signal (ICLK) and when the comparing signal (DET) of the same is "0", the data bit units 23-1, . . . ,23-n each shift the data "0" by one bit to the left from the input side (DL), synchronized with the internal clock signal (ICLK). And when the data bit units 23-1, . . . ,23-n shift "0" to the left and all become "0" and the comparing signal (DET) remains "0", the underflow bit detecting unit 23-0 outputs an underflow signal (UNF) and sets the data bit units 23-1, . . . ,23-n. And when the data bits 23-1, . . . ,23-n shift "1" to the right and all data bits become "1" and the comparing signal (DET) remains "1", the overflow bit detecting unit 23-(N+1) outputs an overflow signal (OVF) and resets the data bit units 23-1, . . . ,23-n.

The data bit units 23-1, . . . ,23-n each include a flip-flop 7 having its output terminal (Q) connected to the forward terminal (F) of the next data bit unit and its set terminal (ST) connected to the output terminal of the underflow bit detecting unit 23-0, and a synchronization multiplexer 8 having its forward terminal (F) connected to the output terminal of the previous data bit unit and its backward terminal (B) connected to the output terminal of the next data bit unit and applying its output signal to the input terminal (D) of the flip-flop 7.

The underflow bit detecting unit 23-0 includes a flip-flop 9 the output terminal (Q) of which is connected to the forward terminal (F) of the data bit unit 23-1 and the reset terminal (RST) of which is connected to ground, a flip-flop 10 having its input terminal connected to the output terminal of the flip-flop 9 and its output terminal (Q) commonly connected to the set terminals (ST) of the flip-flop 9 and the plurality of flip-flops 7, and a synchronization multiplexer 11 having its forward terminal (F) connected to a supply voltage source Vcc and its backward terminal (B) connected to the output terminal (B1) of the bit unit 23-1.

The overflow bit detecting unit 23-(N+1) includes a flip-flop 12 having its output terminal connected to the backward terminal (B) of the multiplexer 8 of bit unit 23-n and its set terminal (ST) connected to the voltage source (Vcc), a flip-flop 13 having its input terminal (D) connected to the output terminal of the flip-flop 12 and its output terminal (Q) commonly connected to the reset terminal of the flip-flop 12 and to the reset terminals (RST) of the plurality of flip-flops 7, and a synchronization multiplexer 14 having its backward terminal (B) grounded and its forward terminal (F) connected to the output terminal of the bit unit 23-n.

Here, the internal clock signal (ICLK) is commonly inputted to the flip-flops 7,9,10,12 and 13, and the comparing signal (DET) is commonly inputted to the selection terminals (S) of the synchronization multiplexers 8,11, and 14. In addition, the flip-flops 7 of the data bit units 23-1, . . . , 23-n, the flip-flop 9 of the underflow bit detecting unit 23-0 and the flip-flop 12 of the overflow bit detecting unit 23-(N+1) are set by a "0" signal, and reset by a "1" signal.

Figure 5:
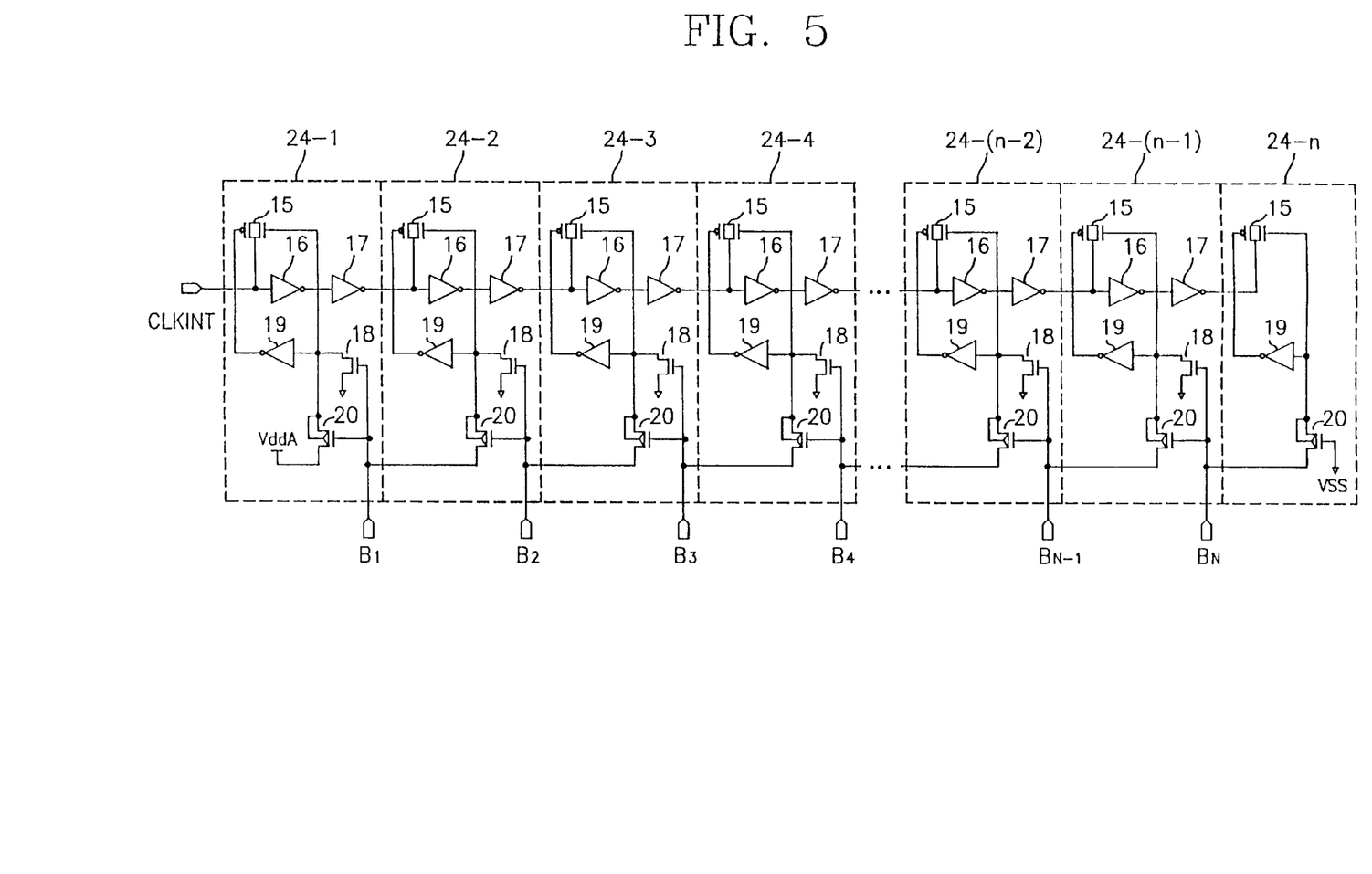
FIG. 5 is a detailed schematic block diagram of a phase delay unit in FIG. 3.

As shown in FIG. 5, the phase delay unit 204 is controlled in accordance with the bit values (B1,B2, . . . ,Bn) outputted from the shift register, and includes a plurality of delay units 24-1,24-2, . . . ,24-(n−1) , 24-n outputting the phase-adjusted clock signal (CKLD) by sequentially delaying the clock signal (CLKINT) outputted from the clock signal amplifier 201.

The delay units 24-1,24-2, . . . 24-(n−1) each includes series inverters 16, 17 which sequentially delay the clock signal (CLKINT) from the clock signal amplifier 201. The output terminal of the shift register 203 is applied to the gate of a PMOS transistor of a transmission gate 15 through an NMOS transistor 18 and an inverter 19, and to an NMOS transistor of the transmission gate 15 through a PMOS transistor 20. Thereby, the phase-adjusted clock signal (CKLD) is outputted by controlling the transmission gates 15 in accordance with the bit values (B1, . . . ,Bn) of the shift register 203.

Here, the delay unit 24-n includes only the transmission gate 15, the inverter 19 and the PMOS transistor 20.

Figure 6:
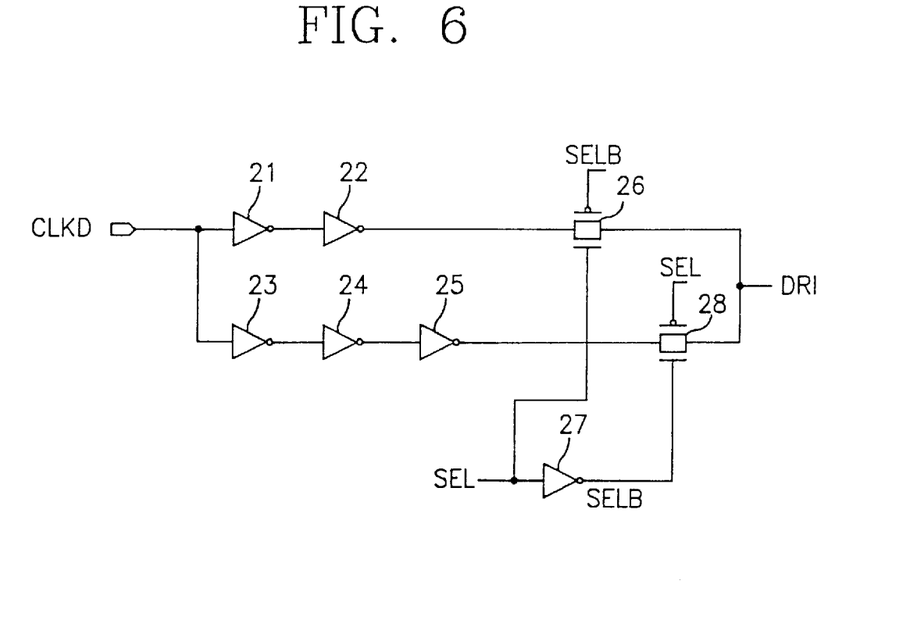
FIG. 6 is a detailed schematic block diagram of a domain selector in FIG. 3.

As shown in FIG. 6, the domain selector 206 includes series inverters 21,22 for sequentially delaying the phase-adjusted clock signal (CLKD) outputted from the phase delay unit 204, a transmission gate 26 for transmitting an output signal of the inverter 22 as the driving signal (DRI) for selecting a first domain in accordance with the domain controlling signal (SEL) from the domain selecting controller 205, and series inverters 23,24,25 for sequentially delaying the phase-adjusted clock signal (CLKD) outputted from the phase delay unit 204, and a transmission gate 28 for transmitting the output signal of the inverter 25 as a driving signal (DRI) for selecting a second domain in accordance with the domain controlling signal (SEL) inverted by an inverter 27.

The operation of the phase delay correction apparatus according to the present invention will now be described with reference to the accompanying drawings.

The clock signal amplifier 201 amplifies a system clock signal (SCLK) and outputs it to the phase delay unit 204. The chip clock signal (CCLK) fed back from the clock signal distributor 207 and the system clock signal (SCLK) are inputted to the phase detector 202. Then the phase detector 202 outputs a comparing signal "1" to shift register 203 when the chip clock signal (CCLK) leads the system clock signal (SCLK) in phase, or outputs a "0" to the shift register 203 when the chip clock signal (CCLK) trails the system clock signal (SCLK) in phase.

When the comparing signal (DET) outputted from the phase detector 202 is "1", the shift register 203 sequentially shifts the data "1" to the right from the input side (DR) and outputs the bit values of "1" (B1, . . . ,Bn), synchronized with the internal clock signal (ICLK). When the comparing signal (DET) is "0", the shift register 203 shifts the data "0" to the left from the input side (DL) and outputs the bit values of "0" (B1, . . . ,Bn) synchronized with the internal clock signal (ICLK).

And, when the shift register 203 performs a shift operation to the right and the bit values (B1, . . . ,Bn) are all "1", if the comparing signal (DET) "1" is inputted, the shift register 203 outputs an overflow signal (OVF), and when the shift register 203 performs a shift operation to the left and the bit values (B1, . . . ,Bn) are all "0", if the comparing signal "0" (DET) is inputted as "0", the shift register 203 outputs an underflow signal (UNF).

First, the former case will now be described in detail.

Here, as shown in FIG. 4, the synchronization multiplexer 11 of the underflow bit unit 23-0 has the voltage source (Vcc) connected as the input side (DR) applied to its forward terminal (F), and output a high level "1" to the flip-flop 9 in accordance with the applied comparing signal (DET) of "1", and then the flip-flop 9 outputs an output signal of "1" from the synchronization multiplexer 11, synchronized with the first cycle of the internal clock signal (ICLK).

Then, the flip-flop 10 outputs "1" in accordance with the output signal of the flip-flop 9 and sets the flip-flop 9 to be "1", and the flip-flops 7 of the data bit units 23-1, . . . ,23-n are set by "0".

The synchronization multiplexer 8 of the data bit unit 23-1 outputs the output value "1" from the underflow bit 23-0 inputted to its forward terminal (F) to the flip-flop 7 in accordance with the comparing signal (DET) "1", and then the flip-flop 7 outputs the output "1" from the synchronization multiplexer 8 to the synchronization multiplexer 8 of the next bit unit 23-2, synchronized with the second cycle of the internal clock signal (ICLK).

Then, the above course is repeatedly performed through the synchronization multiplexers 8 of the data bit units 23-2, 23-3, . . . ,23-n), and as a result, the bit values "1" are outputted through the output terminals (B1,B2, . . . ,Bn) of the data bit units 23-1,23-2, . . . ,23-n, until the data bit units (23-1,23-2, . . . ,23-n) are filled with "1"'s.

In such a condition, when the comparing signal (DET) remains "1", the synchronization multiplexer 14 of the overflow bit 23-(n+1) outputs the bit value (Bn) "1" from the data bit unit 23-n to the flip-flop 12 in accordance with the comparing signal (DET) of "1" applied through its forward terminal (F), and the flip-flop 12 outputs an overflow signal (OVF) of "1" synchronized with the internal clock signal (ICLK).

Here, the overflow signal (OVF) is inputted to the flip-flop 13 and the flip-flop 13 outputs a reset signal (RST), synchronized with the internal clock signal (ICLK), and as a result, the flip-flops 7,12 of the plurality of data bit units 23-1,23-2, . . . ,23-n are reset to "0".

Now, the latter case will be described in detail.

Here, the synchronization multiplexer 14 of the overflow bit unit 23-(n+1) outputs the ground voltage (Vss) from the input side (DL) applied at its the backward terminal (B) to the flip-flop 12, and then the flip-flop 12 latches the "0" output from the synchronization multiplexer 14 at the first cycle of the internal clock signal (ICLK), and outputs it to the data bit unit 23-n.

Then, the synchronization multiplexer 8 of the data bit unit 23-n outputs the output value "0" from the underflow bit unit 23-(n+1) inputted to its backward terminal (2) to the flip-flop 7 in accordance with the comparing signal (DET) of "0", and then the flip-flop 7 latches the "0" output from the synchronization multiplexer 8 in the second cycle of the internal clock signal (ICLK) and outputs it to the data bit unit 23-(n−1).

The above course is repeatedly performed through the synchronization multiplexers 8 of the data bit units 23-2, 23-3, . . . ,23-n, and the flip-flops 7 and as a result, the bit values 0 (B1,B2, . . . ,Bn) are sequentially outputted through the data bit units 23-n, . . ,23-1 and the data bit units 23n, . . . , 23-1 are all filled with "0".

In such a condition, when the comparing signal (DET) remains "0", the synchronization multiplexer 11 of the underflow bit unit 23-0 outputs the bit value (Bn) "0" from the data bit unit 23-n inputted to its forward terminal (F) to the flip-flop 9 in accordance with the comparing signal (DET) of "0", and the flip-flop 9 latches the "0" output from the synchronization multiplexer 11, and outputs an underflow signal (UVF) of "0" synchronized with the internal clock signal (ICLK).

Here, the underflow signal (UVF) is inputted to the flip-flop 10 and the flip-flop 10 outputs a set signal (ST) of "0", synchronized with the internal clock signal (ICLK), and as a result, the flip-flops 7,9 of the plurality of data bit units 23-1,23-2, . . . ,23-n are set to "1".

Next, the phase delay unit 204 is controlled by the bit values (B1,B2, . . . ,Bn) outputted from the shift register 203, and consequently delays the clock signal (CLKINT) from the clock signal amplifier 201, and outputs the phase-adjusted clock signal (CLKD) to the domain selector 206.

That is, as shown in FIG. 5, when the bit values (B1, . . . ,Bn) outputted from the shift register 203 are all "0", only the transmission gate 15 of the delay unit 24-1 among the plurality of delay units 24-1, . . . ,24-n is turned on and consequently a minimum clock signal delay occurs. When the bit values (B1, . . . ,Bn) outputted from the shift register 203 are all "1", only the transmission gate 15 of the delay unit 24-1 among the plurality of delay units 24-1, . . . ,24-n is turned on and consequently a maximum clock signal delay occurs.

When the bit values are not all identical, that is, when the bit values (B1,B2,B3) are not all "1" and the bit values (B4, . . . ,Bn) are not all "0", the transmission gates 15 of the delay units 24-1,24-2,24-3) are turned off, and the transmission gate 15 of the delay unit 24-4 is turned on. Then, the clock signal (CLKINT) is sequentially delayed through the inverters 16,17 of the delay units 24-1,24-2,24-3 to output the phase-adjusted clock signal (CLKD) through the turned-on transmission gate 15 of the delay unit 24-4.

Here, since the delay units 24-1,24-2,24-3 are influenced and operated by the inverters 16,17, the delaying width is reduced, resulting in obtaining precise resolution and the maintenance of a regular delay width.

Then, whenever an overflow or underflow signal is inputted from the shift register 203, the domain selecting controller 205 outputs the domain selection controlling signal (SEL) and the domain selector 206 selects a corresponding signal among the two domains in accordance with the domain selection controlling signal (SEL), and outputs the driving signal (DRI) having a predetermined phase from the selected domain.

That is, as shown in FIG. 6, when the domain selection controlling signal is "1", the transmission gate 26 of the domain selecting controller 205 is turned on, and consequently the phase-adjusted clock signal (CLKD) from the phase delay unit 204 is sequentially delayed through inverters 21,22, and outputted as the driving signal (DRI) of the first domain. When the domain selection controlling signal (SEL) is "0", the transmission gate 28 is turned on, and consequently the clock signal (CLKD) from the phase delay unit 204 is sequentially delayed through inverters 23,24,25 and is outputted as the driving signal (DRI) of the second domain.

Figure 7:
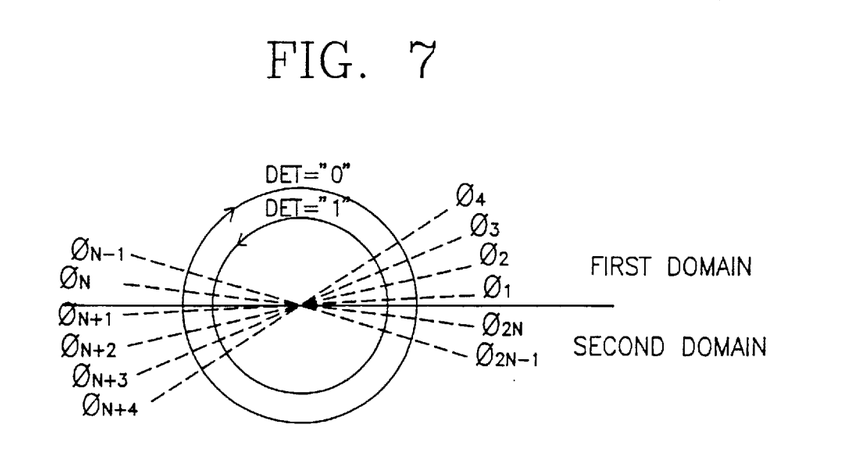
FIG. 7 is an exemplary view showing a phase delay in a first domain and a second domain according to the present invention.
Figures 8A, 8B:
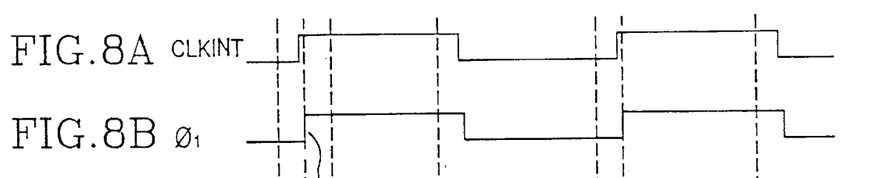
FIGS. 8A through 8F are an exemplary view showing a domain transition of the phase of a driving signal according to the present invention.
Figures 8C, 8D, 8E, 8F:
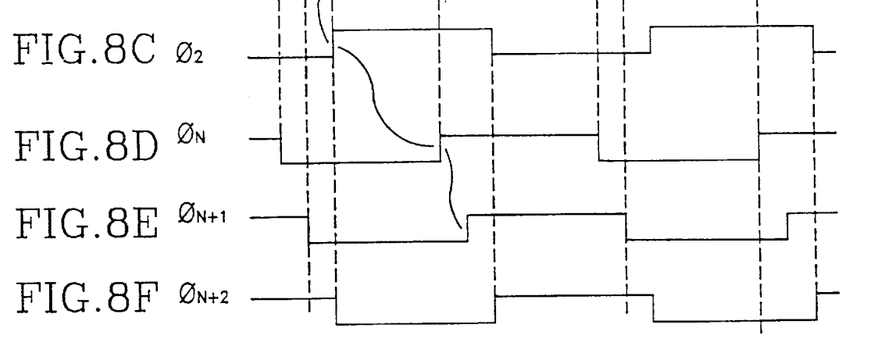

Therefore, as shown in FIG. 7, the domain selecting controller 205 repeatedly determines one domain having a phase of 0°~180°, and the other domain having a phase of 180°~360° in accordance with the domain selection controlling signal (SEL).

Here, the overall delay times of the parallel series inverters 21,22 and 23,24,25 should be matched with each other.

Now, the domain selection course of the domain selecting controller 205 and the domain selector 206 will be described in detail.

First, in accordance with a comparing signal (DET) of "1" outputted from the phase detector 202, the shift register 203 performs a shifting operation to the right, and consequently an overflow signal (OVF) is generated for one clock cycle, and in accordance with the overflow signal, the flip-flop 13 resets the flip-flops 7,12 to "0".

As the flip-flops 7 are reset, the bit values (B1, . . . , Bn) all become "0", and an underflow signal (UNF) "1" is outputted from the underflow bit unit 23-0, and an overflow signal (OVF) "0" is outputted from the overflow bit unit 23-(N+1).

The bit values "0" of the shift register 203 (B1 . . . ,Bn) are inputted to the delay units 24-1, . . . ,24-n of the phase delay unit 204 as shown in FIG. 5, and the transmission gates 15 are turned on in accordance with the bit values of "0", and consequently the clock signal (CLKINT) is delayed by as much as the off-set delay and is outputted as the clock signal (CLKD)

When an underflow or overflow is not generated, the domain selecting controller 205 at this time (that is, when the underflow signal (UNF) is "1" and the overflow signal (OVF) is "0"), the domain selecting controller 205 outputs a high level of domain controlling signal (SEL), and in accordance with the high level domain controlling signal (SEL), the transmission gate 26 of the domain selector 206 is turned on, and as the result the clock signal (CLKD) is outputted through the inverters 21,22 as a driving signal (DRI) of the first domain.

Here, the phase of the driving signal (DRI) is selected in the first domain in accordance with the high level of the domain controlling signal (SEL), and the phase becomes 1 as shown in FIG. 7. At this time the delay of the inverters 21,22 is not important.

Next, the shift register 203 performs a shifting operation to the right in accordance with the comparing signal of "1" outputted from the phase detector 202, and as a result, the bit values (B1) of the data bit unit 23-1 is outputted, and the bit values "0" of the other data bit units 23-2, . . . ,23-n are outputted.

Here, in accordance with the bit values, the transmission gate 15 of the delay unit 24-1 is turned off in the phase delay unit 204 and the transmission gate of the delay unit 24-2 is turned on. As a result, the clock signal (CLKINT) is delayed through the inverters 16,17 and outputted as the phase-adjusted clock signal (CLKD).

Then, since an underflow or overflow is not generated, the domain selecting controller 205 outputs a high level domain controlling signal (SEL) to the domain selector 206 as shown in FIG. 6 and consequently the phase of the driving signal (DRI) outputted from the domain selector 206 becomes 2 as shown in FIG. 7.

When the phase detector 202 continues outputting a comparing signal of "1" to the shift register 203, and when in accordance with the comparing signal (DET) the shift register 203 sequentially outputs the bit values of "1" (B1, . . . ,Bn) through the data bit units 23-2,23-3, . . . ,23-n, the phase of the driving signal (DRI) is adjusted through the same course as described above to become 3, . . . ,n−1, until the phase of the maximum delayed driving signal becomes n as shown in FIGS. 8A through 8F.

When the data bit units 23-2,23-3, . . . ,23-n are filled with "1" while the phase detector 202 continues outputting a comparing signal (DET) of "1", the overflow bit unit 23-(n+1) outputs an overflow signal (OVF) for one clock cycle, and the overflow signal (OVF) is inputted to the flip-flop 13 and the flip-flop 13 outputs a reset signal (RST). As a result, the flip-flops 7 of the data bit units 23-2,23-3, . . . ,23-n and the flip-flop 12 of the overflow bit unit 23-(n+1) are reset to be The domain selecting controller 205 detects the overflow signal (OVF) of "1" outputted from the overflow bit unit 23(n+1) and outputs a low level domain selecting control signal (SEL) representing a domain transition. Then, in accordance with the low level domain selecting control signal (SEL), the transmission gate 28 of the domain selector 206 is turned on, and accordingly the clock signal (CKLD) outputted from the phase delay unit 204 is outputted through the inverters 23,24,25 and the transmission gate 28, and consequently, the phase of the driving signal (DRI) is shifted to the second domain and becomes n+1.

In such an above condition, when the phase detector 202 keeps on outputting a comparing signal of "1", the bit units 23-1, . . . ,23-n of the shift register 203 sequentially outputs the bit values of "1" through the same course as described above, and the phases of the driving signal (DRI) outputted from the domain selector 206 become n+2, . . . ,2n.

Next, when an overflow signal (OVF) is generated again, the phase of the driving signal is shifted to the first domain, 01.

Therefore, as the same course as described above is repeatedly performed, the phase of the driving signal (DRI) is continuously shifted to the first domain or the second domain.

Meanwhile, in accordance with a comparing signal of "0" outputted from the phase detector 202, the shift register 203 performs a shift operation to the left and an underflow signal (UNF) is generated for one clock cycle. And in accordance with the underflow signal (UNF), the flip-flops 7,9 are reset to "1".

Here, when the comparing signal of "0" continues to be inputted to the shift register 203 from the phase detector 202, the synchronization multiplexer 14 of the overflow bit unit 23-(n+1) outputs the voltage (Vss) level applied at its backward terminal (B) to the bit units 23-n and accordingly the bit units 23-n, . . . ,23-1 sequentially output the bit values (Bn, . . . ,B1) of "0".

Since an underflow or an overflow is not generated, a "1" is outputted from the underflow bit unit 23-0 and a "0" is outputted from the overflow bit 23-(N+1).

Therefore, in accordance with the bit values of "0" outputted from the bit units 23-n, . . . ,23-1, the delay units 24-n, . . . ,24-1 of the phase delay unit 204 are controlled, and consequently the phase of the driving signal (DRI) outputted from the domain selector 206 advances, such as n−1, . . . ,1.

As described above, when the shift register 203 shifts "0" to the left and all the bits become "0" and the phase detector 202 keeps on outputting a comparing signal of "0", the underflow bit unit 23-0 outputs an underflow signal (UNF) of "0", and the flip-flop 10 outputs a set signal (ST) in accordance with the underflow signal (UNF) and the flip-flops 7,11 are set to "1".

Therefore, as shown in FIG. 5, when the transmission gate 15 of the delay unit 23-n is turned on in accordance with the bit values (B1,B2, . . . ,Bn), a maximum clock signal delay occurs through the inverters 16,17 of the delay units 24-1, . . . , 24-(n−1) and the transmission gate 15 of the delay unit 24-n.

Next, when the domain selecting controller 205 outputs a low level domain controlling signal (SEL) representing a transition to the second domain, in accordance with the underflow signal of "0", a maximum delayed clock signal (CLKD) is outputted through the inverters 23,24,25 and the transmission gate 28 and the phase of the driving signal (DRI) is shifted to the second domain and becomes 2n.

Here, when the phase detector 202 continues to output a comparing signal (DET) of "0", the bit units 23-n, . . . ,23-1 of the shift register 203 sequentially output the bit values of "1" through the above-described course, and as a result, the phase of the driving signal (DRI) outputted from the domain selector 206 advances, such as 2n−1, . . . ,n+1.

As the same course as described above is repeatedly performed, the phase of the driving signal (DRI) is repeatedly shifted to the first domain or the second domain.

The clock signal amplifier 201 can be omitted if the system clock signal (SCLK) has a relatively low frequency range and a large swing.

Therefore, the driving signal (DRI) from the domain selector 206 is inputted to the clock signal distributor 207 and the clock signal distributor 207 generates clock signals necessary to various components inside the chip and a chip clock signal (CCLK) for the phase detection. Then the chip clock signal (CCLK) is fed back to the phase detector 202, and the operation is repeatedly performed.

As described above, the present invention can provide an indefinite delay range by adjusting the phase of the driving signal in one domain comprising 0°~180° and in the other domain comprising 180°~360° and performing a domain transition in accordance with an underflow signal or an overflow signal when the phase reaches the boundary between the two domains.

In addition, the number of the delaying elements of the present invention can be reduced to half, since the phase shift is performed only in the first domain and the phase shift in the second domain is performed inverse to the phase shift in the first domain.

Finally, the present invention has the effect that a phase shift apparatus having a more precise resolution can be embodied, by reducing the number of the elements comprising the delay units.

What is claimed is:

1. A phase delay correction apparatus in a digital delay locked loop having a phase detector for outputting a comparing signal by comparing the phase of a system clock signal with that of a chip clock signal, and a clock signal distributor for distributing the chip clock signal and feeding the chip clock signal back to the phase detector, comprising;

a shift register for sequentially shifting bit values in accordance with the comparing signal from the phase detector and outputting an overflow signal and an underflow signal in response to an overflow and underflow condition, respectively, of the shifted data;

a phase delay unit for outputting a phase-adjusted clock signal by delaying the system clock signal in accordance with the bit values outputted from the shift register;

a domain selecting controller for outputting a domain controlling signal in response to the overflow signal and the underflow signal generated by the shift register; and a domain selector for outputting a driving signal for a domain operation in accordance with the domain controlling signal.

2. The apparatus of claim 1, wherein said shift register includes a plurality of data bit units for outputting data bit values shifted to the left and right in accordance with the comparing signal from the phase detector, synchronized with a clock signal, an underflow bit unit located at a front end of the data bit units for detecting the underflow condition and setting the data bit units when the data bit units sequentially shift the bit values of "0" to the left, and an overflow bit unit located at a back end of the data bit units for detecting an overflow signal and resetting the data bit units when the data bits sequentially shift the bit values of "1" to the right.

3. The apparatus of claim 2, wherein said plurality of the data bit units each comprises;

a flip-flop having an output terminal for outputting a data bit value; and a synchronization multiplexer for receiving at a selecting terminal thereof the comparing signal from the phase detector, and having a forward input terminal and a backward input terminal wherein the flip-flop has a clock terminal receiving a clock signal, an input terminal connected to an output terminal of the synchronization multiplexer, an output terminal providing a bit output of the data bit unit and connected to both the forward input terminal of the synchronization multiplexer of the succeeding data bit unit, and the backward input terminal of the preceding data bit unit, a set terminal connected to a set output terminal of the underflow detectin bit unit, and a reset terminal connected to a reset output terminal of the overflow bit detecting unit.

4. The apparatus of claim 2, wherein said underflow bit detecting unit comprises;
   a first flip-flop having a clock signal input terminal receiving a clock signal, an input terminal, an output terminal, a set terminal, and a reset terminal connected to ground;
   a second flip-flop having a clock terminal receiving the clock signal, an input terminal connected to the output terminal of the first flip-flop, and an output terminal connected to the set terminal of the first flip-flop; and
   a synchronization multiplexer having a forward terminal connected to a voltage source, a selecting input terminal receiving comparing signal, a backward terminal connected to the output terminal of the first data bit unit, and an output terminal connected to the input terminal of the first flip-flop.

5. The apparatus of claim 2, wherein said overflow detecting bit unit comprises;
   a first flip-flop having a clock signal terminal receiving a clock signal, an input terminal, an output terminal, a set terminal connected to a voltage source and a reset terminal;
   a second flip-flop having a clock terminal receiving the clock signal, an input terminal connected to the output terminal of the first flip-flop, and an output terminal commonly connected to the reset terminal of the first flip-flop; and
   a third synchronization multiplexer having a backward input terminal connected to ground, a selecting input terminal receiving the comparing signal, a forward terminal commonly connected to an output terminal of the last data bit unit, and an output terminal connected to the input terminal of the first flip-flop.

6. The apparatus of claim 1, wherein said phase delay unit includes a plurality of delay units controlled in accordance with the bit values outputted from the shift register for outputting a phase-adjusted clock signal by sequentially delaying the system clock signal,
   wherein each but the last of the plurality of delay units comprises first and second inverters for sequentially delaying the system clock signal;
   and wherein an output terminal of the shift register is connected to a gate of a PMOS transistor of a first transmission gate through a first NMOS transistor and a third inverter and is connected to a gate of a second NMOS transistor of the first transmission gate through a second PMOS transistor; and
   wherein the last delay unit includes a first transmission gate, a fourth inverter and a third PMOS transistor.

7. The apparatus of claim 1, wherein said domain selector includes;
   first and second inverters connected in series for sequentially delaying a clock signal outputted from the phase delay unit;
   a first transmission gate connected to an output of the second inverter for outputting a driving signal of a first domain in accordance with one state of the domain selection controlling signal outputted from the domain selecting controller;
   third, fourth and fifth inverters connected in series for sequentially delaying the clock signal outputted from the phase delay unit; and
   a second transmission gate connected to an output of the fifth inverter for outputting the driving signal of a second domain in accordance with another state of the domain selection controlling signal inverted by the sixth inverter.

8. The apparatus of claim 1, wherein said domain selecting controller provides a domain transition by outputting an inverted domain selection controlling signal whenever an underflow or an overflow condition is detected by the underflow bit detecting unit and the overflow bit detecting unit.

9. A phase delay correction apparatus in a digital delay locked loop having a clock signal amplifier for amplifying a system clock signal, a phase detector for outputting a comparing signal by comparing a phase of the system clock signal with that of a chip clock signal, and a clock signal distributor for distributing the chip clock signal and feeding the chip clock signal back to the phase detector in accordance with a driving signal of a domain selector, comprising:
   a shift register for sequentially shifting data bit value in both the directions in accordance with the comparing signal from the phase detector;
   a phase delay unit for outputting a phase-adjusted clock signal by delaying the output of the clock signal amplifier in accordance with the bit values shifted in the shift register;
   a domain selecting controller for outputting a domain selection controlling signal by detecting an overflow signal condition or an underflow signal condition generated by the shift register; and
   a domain selector for outputting a driving signal of the first domain selected in accordance with the domain selection controlling signal from the domain selecting controller and outputting a driving signal of a second domain when one of an overflow signal condition and an underf low signal condition is generated when one of the driving signal exists in the boundary area of the selected first domain.

* * * * *